United States Patent
Kato et al.

(10) Patent No.: US 9,550,273 B2
(45) Date of Patent: Jan. 24, 2017

(54) POLISHING DEVICE AND METHOD OF POLISHING SEMICONDUCTOR WAFER

(71) Applicant: Kabushiki Kaisha Toshiba, Minato-ku (JP)

(72) Inventors: Shiguma Kato, Yokohama (JP);
Yuichiro Fujiyama, Kobe (JP);
Takumi Takahashi, Yokkaichi (JP);
Taku Maruo, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 70 days.

(21) Appl. No.: 14/736,390

(22) Filed: Jun. 11, 2015

(65) Prior Publication Data

US 2016/0207165 A1    Jul. 21, 2016

(30) Foreign Application Priority Data

Jan. 19, 2015  (JP) .................. 2015-007898

(51) Int. Cl.
*B24B 49/10*  (2006.01)
*B24B 49/16*  (2006.01)
*H01L 21/66*  (2006.01)
*B24B 21/04*  (2006.01)

(52) U.S. Cl.
CPC ............... *B24B 49/16* (2013.01); *B24B 21/04* (2013.01); *H01L 22/20* (2013.01)

(58) Field of Classification Search
CPC .................................. B24B 49/10; B24B 49/00
USPC .................. 451/63, 5, 8, 9, 10, 388, 44, 289
See application file for complete search history.

(56) References Cited

U.S. PATENT DOCUMENTS

| | | | | |
|---|---|---|---|---|
| 5,643,044 A * | 7/1997 | Lund | ....................... | B24B 21/00 451/168 |
| 6,431,953 B1 * | 8/2002 | Carter | .................. | B24B 37/013 451/10 |
| 7,993,485 B2 * | 8/2011 | Wasinger | .................. | B24B 1/04 156/345.12 |

FOREIGN PATENT DOCUMENTS

| | | |
|---|---|---|
| JP | 7-201790 | 8/1995 |
| JP | 9-139367 | 5/1997 |
| JP | 2013-103318 | 5/2013 |

* cited by examiner

*Primary Examiner* — Robert Rose
(74) *Attorney, Agent, or Firm* — Oblon, McClelland, Maier & Neustadt, L.L.P.

(57) ABSTRACT

According to an embodiment, a polishing device includes a stage, a polishing unit, and a strain measuring unit. The stage is rotatable together with a semiconductor wafer. The polishing unit polishes the rear surface of the semiconductor wafer mounted on the stage beside the stage. The strain measuring unit measures a first strain that is a radial-direction strain of the semiconductor wafer and a second strain that is a circumferential-direction strain of the semiconductor wafer during the polishing.

15 Claims, 7 Drawing Sheets

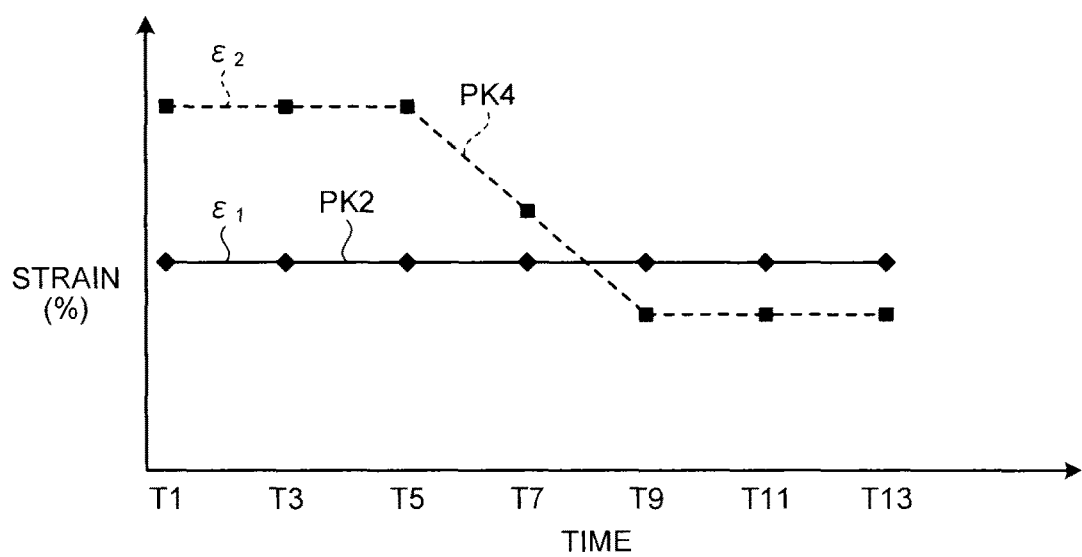

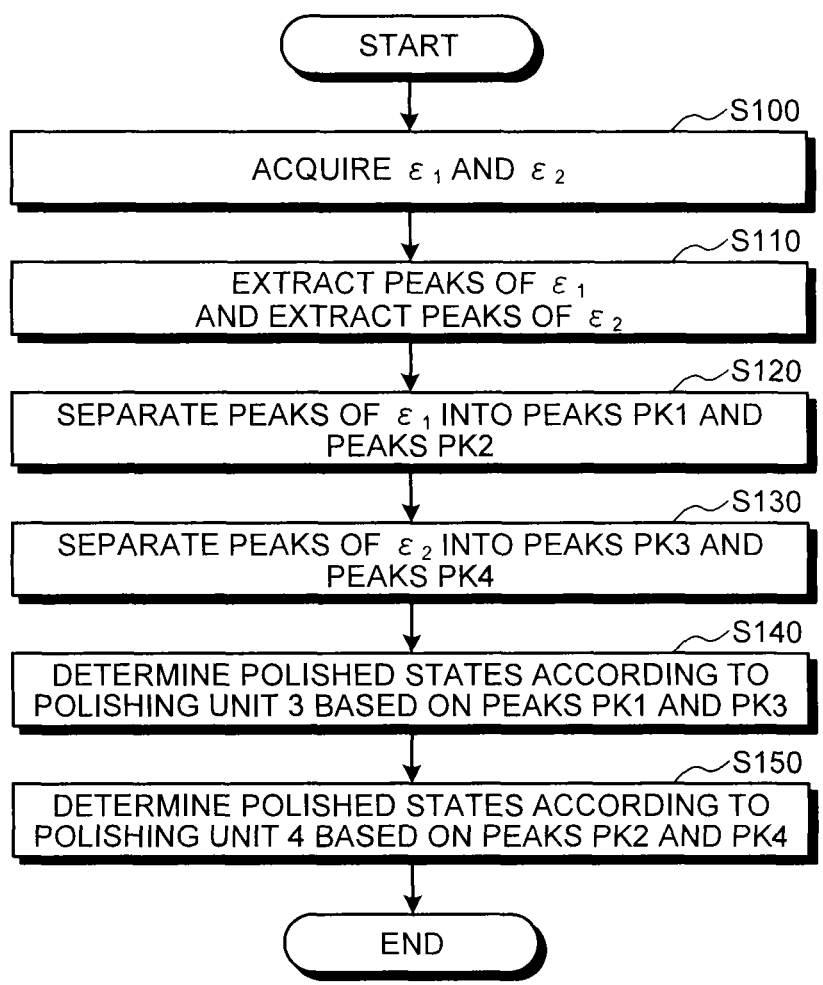

POLISHING DEVICE AND METHOD OF POLISHING SEMICONDUCTOR WAFER

CROSS-REFERENCE TO RELATED APPLICATIONS

This application is based upon and claims the benefit of priority from Japanese Patent Application No. 2015-007898, filed on Jan. 19, 2015; the entire contents of which are incorporated herein by reference.

FIELD

Embodiments described herein relate to a polishing device and a method of polishing a semiconductor wafer.

BACKGROUND

In a process for manufacturing a semiconductor device, rear-surface polishing is performed to remove an unnecessary film (burr) formed at an outer circumferential part of the rear surface of a semiconductor wafer. The polished state of the rear surface of a semiconductor wafer, for example, can be determined based on a change in the rotational torque of a stage on which the semiconductor wafer is mounted. However, according to such a technique, while the polished state of the rear surface can be roughly acquired in a macroscopic manner, it is difficult to perform a high-precision determination.

BRIEF DESCRIPTION OF THE DRAWINGS

FIG. 4C is a timing diagram that illustrates a result of extraction of remaining peaks from the measurement result acquired by the strain gauge;
FIG. 5 is a flowchart that illustrates the process sequence for determining a polished state.

DETAILED DESCRIPTION

In general, according to the present embodiment, a polishing device includes a stage, a polishing unit, and a strain measuring unit. A semiconductor wafer is mounted on the stage. The stage sucks a center side of a rear surface of the semiconductor wafer and is rotatable together with the semiconductor wafer. The polishing unit applies a force to and polishes the rear surface of the semiconductor wafer mounted on the stage. The polishing unit polishes the rear surface of the semiconductor wafer beside the stage. The strain measuring unit measures a first strain and a second strain during the polishing. The first strain is a radial-direction strain of the semiconductor wafer. The second strain is a circumferential-direction strain of the semiconductor wafer. The strain measuring unit is disposed on the stage.

Exemplary embodiments of a polishing device and a method of polishing a semiconductor wafer will be explained below in detail with reference to the accompanying drawings. The present invention is not limited to the following embodiments.

Figure 1:
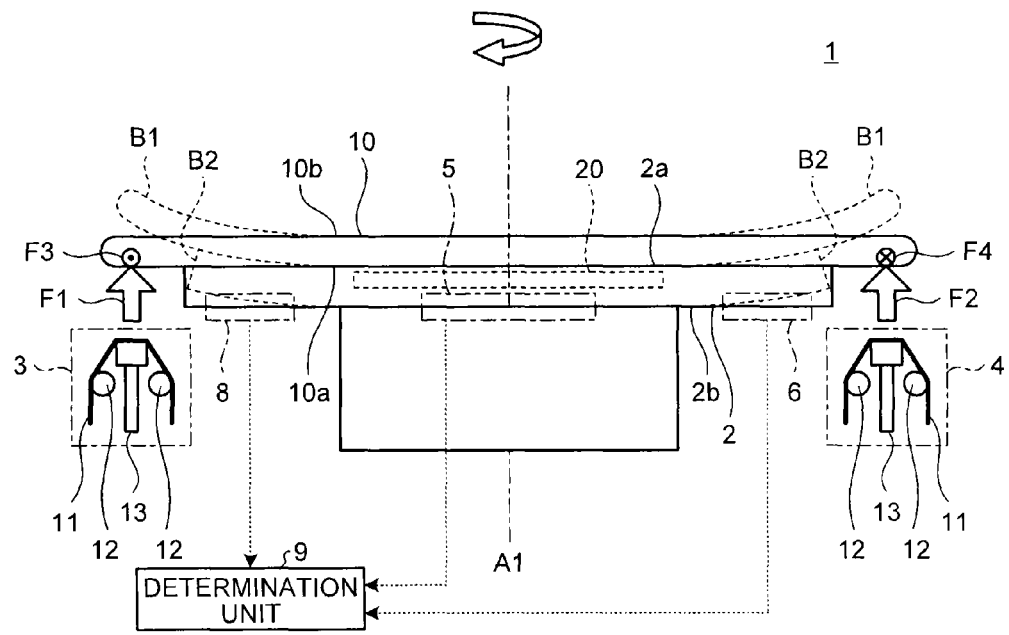
FIG. 1 is a side view that illustrates the configuration of a polishing device according to an embodiment.
Figure 2:
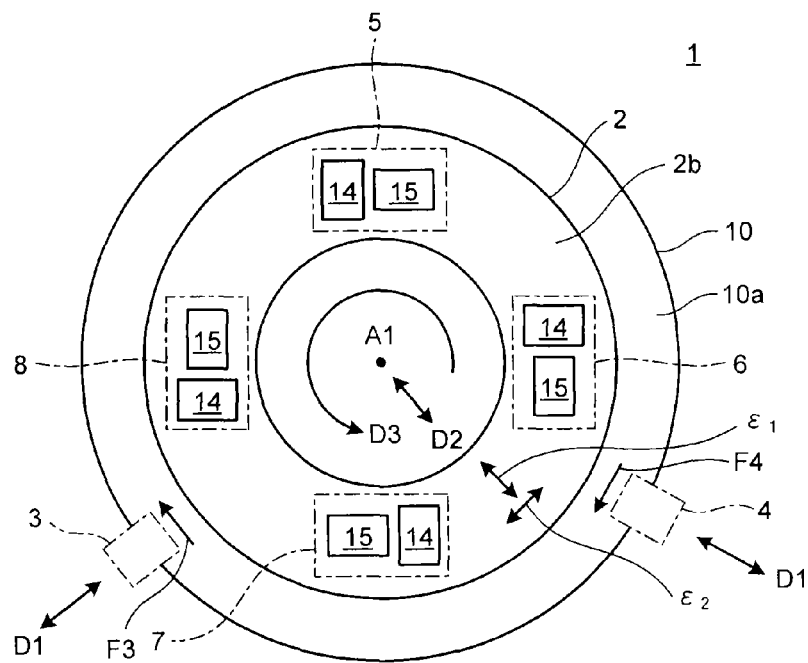
FIG. 2 is a bottom view of the polishing device illustrated in FIG. 1.

FIG. 1 is a diagram that illustrates the configuration of a polishing device 1 according to an embodiment. FIG. 2 is a bottom view of the polishing device 1 illustrated in FIG. 1. The polishing device 1 includes a stage 2, a plurality of polishing units 3 and 4, a plurality of strain measuring units 5, 6, 7, and 8, and a determination unit 9. The number of the polishing units is not limited to two but may be one or three or more. The stage 2, for example, includes a vacuum suction mechanism 20 and can hold a semiconductor wafer 10 mounted on the upper face 2a of the stage 2 through vacuum suction. The vacuum suction mechanism 20 sucks a first area of the rear surface of the semiconductor wafer 10. The first area is disposed on the center side (axis A1 side) relative to polishing areas for the polishing units 3 and 4.

When a rotation force is applied from a rotation mechanism such as a motor not illustrated in the figure, the stage 2 rotates about the axis A1 at a high speed and rotates the semiconductor wafer 10 mounted on the upper face 2a at the high speed. The axis A1 is approximately perpendicular to the upper face 2a. The rear surface 10a of the semiconductor wafer 10 is mounted on the upper face 2a of the stage 2. On the front surface 10b of the semiconductor wafer 10, a chip area including devices and wirings is formed. A plurality of layers of reaction products (deposited films) are formed on the front surface 10b of the semiconductor wafer 10, and a burr (not illustrated in the figure) is formed in an outer circumferential part (outer edge part) of the rear surface 10a of the semiconductor wafer 10. Bumps are formed at the outer circumferential part (outer edge part) of the rear surface 10a of the semiconductor wafer 10 by the burrs. The bumps are formed as the deposited film wraps around the rear surface 10a of the semiconductor wafer 10 through the side face of the semiconductor wafer 10.

The polishing units 3 and 4 are arranged at the outer circumferential part of the rear surface 10a of the semiconductor wafer 10, which is mounted on the upper face 2a of the stage 2, beside of the stage 2. Each of the polishing units 3 and 4 includes a polishing tape 11, a plurality of guide rollers 12, and a head 13. The polishing tape 11 is supplied from a supply reel (not illustrated) to between the head 13 and the rear surface 10a of the semiconductor wafer 10. The polishing tape 11 is wound around the guide roller 12 and a predetermined pressure is applied from the head 13 at between the plurality of guide rollers 12. The polishing tapes 11 of the polishing units 3 and 4 are in contact with outer circumferential parts of the rear surface 10a of the semiconductor wafer 10 and apply forces to the rear surface 10a from the bottom to the top with polishing pressures F1 and F2. The polishing pressures F1 and F2 are forces directed from the rear surface 10a of the semiconductor wafer 10 to the front surface 10b. On a contact face of the polishing tape 11 that is brought into contact with the semiconductor wafer 10, abrasive grains such as diamonds are fixed. The outer circumferential part of the rear surface 10a is polished by the friction generated between the polishing tapes 11 and the rear surface 10a of the high-speed rotating semiconductor wafer 10, thus removing the burrs. The polishing tape 11 is traveled at a predetermined speed from the supply reel not illustrated toward a collecting reel, and the contacting surface abraded by the polishing of the rear surface 10a is collected by the collecting reel. The polishing units 3 and 4 are movable in the radial direction D1 of the semiconductor wafer 10, and the polishing positions on the rear surface 10a of the semiconductor wafer 10 can be adjusted. By arranging dispersedly a plurality of the polishing units 3 and 4, a time required for polishing time the rear surface 10a of the semiconductor wafer 10 can be shortened.

The strain measuring units 5 to 8 are fixed to the lower face 2b of the stage 2. Each of the strain measuring units 5, 6, 7, and 8 includes one pair of strain gauges 14 and 15. The strain gauge 14 detects a strain generated in the radial direction of the semiconductor wafer 10 by measuring a strain $\epsilon_1$ of the stage 2 that is generated in the radial direction D2. The strain $\epsilon_1$ is represented as a ratio ($\Delta L1/L1$) of an expansion/contraction amount $\Delta L1$ to the original length L1 along the radial direction of the lower face 2b of the stage 2. In this embodiment, the strain $\epsilon_1$ is represented in a percentage (%). As illustrated in FIG. 1, when the polishing pressures F1 and F2 are applied to the rear surface 10a, the semiconductor wafer 10, as denoted by a dotted line B1, is warped from the rear surface 10a toward the front surface 10b. As described above, the upper face 2a of the stage 2 sucks the semiconductor wafer 10. Therefore, the stage 2, as denoted by a dotted line B2 in FIG. 1, is warped from the lower face 2b toward the upper face 2a in accordance with the warping of the semiconductor wafer 10. Thus, the strain $\epsilon_1$ according to such a warped state of the stage 2 is generated. The strain $\epsilon_1$ changes according to the polishing pressures F1 and F2 and increases as the polishing pressures F1 and F2 increase. Accordingly, based on the strain $\epsilon_1$ measured by the strain gauge 14, the magnitudes of the polishing pressures F1 and F2 can be determined. The strain gauge 14 transmits a result of the measurement of the strain $\epsilon_1$ to the determination unit 9.

The strain gauge 15 detects a strain generated in the circumferential direction (rotation direction) of the semiconductor wafer 10 by measuring a strain $\epsilon_2$ of the stage 2 that is generated in the rotation direction D3 of the stage 2. The strain $\epsilon_2$ is represented as a ratio ($\Delta L2/L2$) of an expansion/contraction amount $\Delta L2$ to the original length L2 along the rotation direction of the lower face 2b of the stage 2. In this embodiment, the strain $\epsilon_2$ is represented in a percentage (%). The strain $\epsilon_2$ is generated according to frictional forces F3 and F4 generated at contact portions of the rear surface 10a of the semiconductor wafer 10 and the polishing units 3 and 4. As illustrated in FIG. 1, the frictional forces F3 and F4 are generated as the result of the rotation of the semiconductor wafer 10 and the polishing pressures F1 and F2 acting on the rear surface 10a of the semiconductor wafer 10. The strain $\epsilon_2$ changes according to the magnitudes of the frictional forces F3 and F4. As described above, the burr is configured by a plurality of layers of deposited films, and the film qualities of the layers are different from each other. Accordingly, when the layer of a polishing target is changed according to the progress of the polishing process, the frictional forces F3 and F4 change. Thus, a polished amount or a polished depth of the rear surface 10a of the semiconductor wafer 10 can be determined based on the strain $\epsilon_2$ that is measured by the strain gauge 15. The strain gauge 15 transmits a result of the measurement of the strain $\epsilon_2$ to the determination unit 9.

The strain gauges 14 and 15 are fixed to the stage 2 and thus, are rotated according to the rotation of the stage 2. Thus, the positions of the strain gauges 14 and 15 with respect to the polishing units 3 and 4 are periodically changed according to the rotation. Accordingly, the strain gauges 14 and 15 can measure the strains $\epsilon_1$ and $\epsilon_2$ at movement positions of the polishing units 3 and 4.

When results of the measurements of the strains $\epsilon_1$ and $\epsilon_2$ are received from the strain gauges 14 and 15, the determination unit 9 determines the polished state of the semiconductor wafer 10 based on the received strains $\epsilon_1$ and $\epsilon_7$. The polished state determined by the determination unit 9, as will be described later, includes whether the polished state of the polishing units 3 and 4 is normal or abnormal, a polished amount (or a polished depth) according to the polishing unit 3, and a polished amount (or a polished depth) according to the polishing unit 4.

Figure 3A:
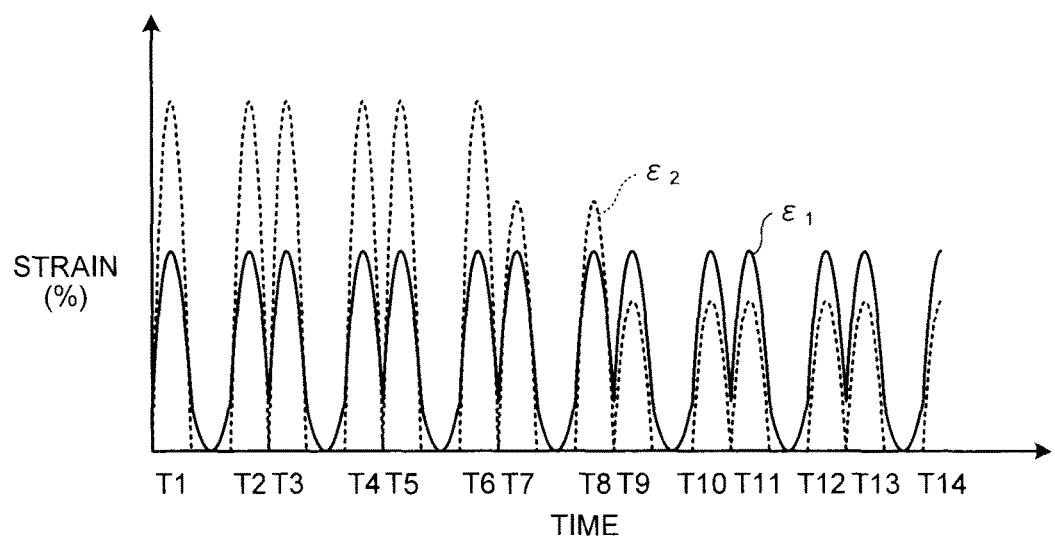
FIG. 3A is a timing diagram that illustrates a first example of a measurement result acquired by a strain gauge.
Figure 3B:
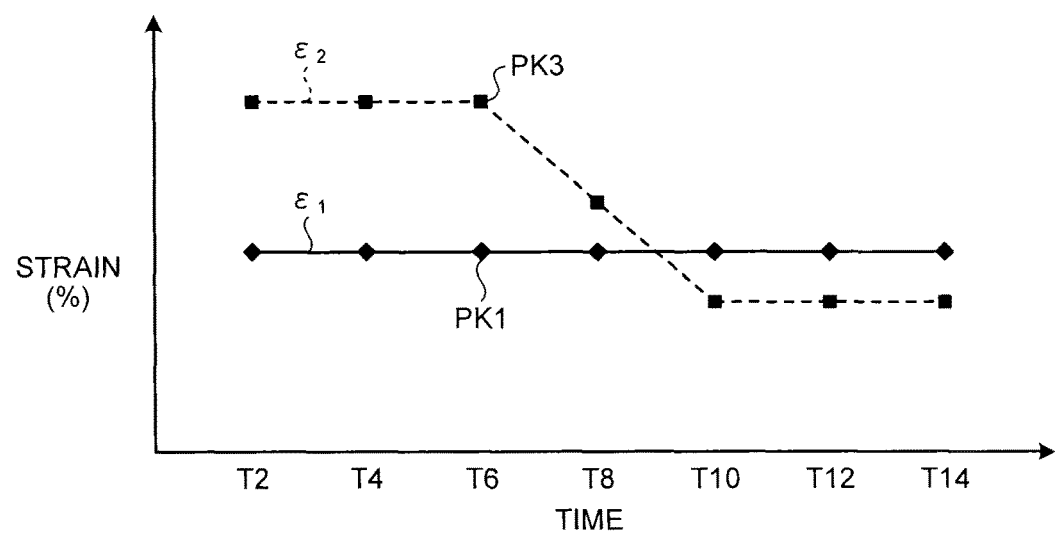
FIG. 3B is a timing diagram that illustrates a result of extraction of some peaks from the measurement result acquired by the strain gauge.
Figure 3C:
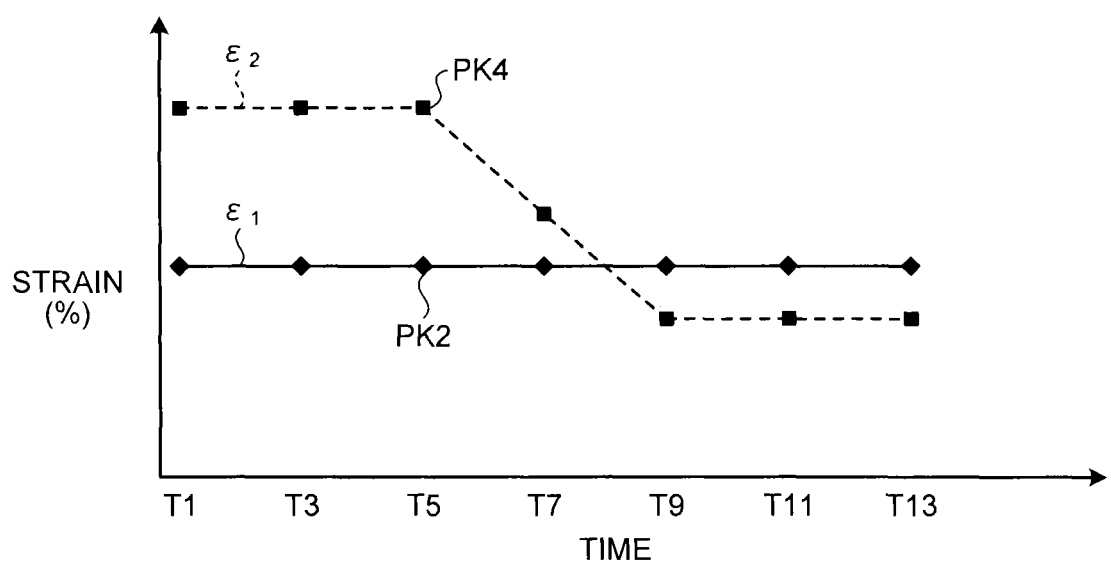
FIG. 3C is a timing diagram that illustrates a result of extraction of remaining peaks from the measurement result acquired by the strain gauge.

FIG. 3A is a diagram that illustrates a first example of a result of measurements of the strains $\epsilon_1$ and $\epsilon_2$ acquired by using the strain gauges 14 and 15. In FIGS. 3A to 3C, the horizontal axis represents the time, and the vertical axis represents the strain. In FIG. 3A, a measurement result (strain $\epsilon_1$) acquired by the strain gauge 14 is illustrated using a solid line, and a measurement result (strain $\epsilon_2$) acquired by the strain gauge 15 is illustrated using a dotted line. FIG. 3A illustrates an example of the result of measurements of the strains $\epsilon_1$ and $\epsilon_2$ acquired by using the strain gauges 14 and 15 included in one of the plurality of strain measuring units 5 to 8 illustrated in FIG. 2. As illustrated in FIG. 3A, in the result of measurements of the strains $\epsilon_1$ and $\epsilon_2$, a peak that is strongly influenced by one polishing unit 3 and a peak that is strongly influenced by the other polishing unit 4 are alternately generated. More specifically, peaks illustrated at time T2, T4, T6, T8, T10, T12, and T14 illustrate peaks (hereinafter, referred to also as peaks corresponding to the polishing unit 3) that are strongly influenced by the polishing unit 3. In addition, peaks illustrated at time T1, T3, T5, T7, T9, T11, and T13 illustrate peaks (hereinafter, referred to also as peaks corresponding to the polishing unit 4) that are strongly influenced by the polishing unit 4.

FIG. 3B is a diagram acquired by extracting the peaks PK1 and PK3 that are strongly influenced by the polishing unit 3 from a plurality of peaks illustrated in FIG. 3A and plotting the extracted peaks. In FIG. 3B, a plurality of peaks PK1 represented as rhombus-shaped points connected using a solid line correspond to the peaks of the strain $\epsilon_1$. In addition, in FIG. 3B, a plurality of peaks PK3 represented as square-shaped points connected using a dotted line correspond to the peaks of the strain $\epsilon_2$. FIG. 3C is a diagram acquired by extracting the peaks PK2 and PK4 that are strongly influenced by the polishing unit 4 from the plurality of peaks illustrated in FIG. 3A and plotting the extracted peaks. In FIG. 3C, a plurality of peaks PK2 represented as rhombus-shaped points connected using a solid line correspond to the peaks of the strain $\epsilon_1$. In addition, in FIG. 3C, a plurality of peaks PK4 represented as square-shaped points connected using a dotted line correspond to the peaks of the strain $\epsilon_2$.

As illustrated in FIG. 3B, in a case where the peak PK1 corresponding to the polishing unit 3 is constant, it can be determined that the polishing unit 3 polishes the semiconductor wafer 10 with constant polishing pressure F1. In addition, in a case where the semiconductor wafer 10 is polished with the constant polishing pressure F1, a change in the peak PK3 illustrated in FIG. 3B represents a change in the polished layer of the semiconductor wafer 10. Accordingly, the polished amount (or the polished depth) of the semiconductor wafer 10 according to the polishing unit 3 can be determined based on a change in the peak PK3. For the example illustrated in FIG. 3B, it can be determined that, by the polishing unit 3, a first layer of the burr of the semiconductor wafer 10 is polished at time T2 to time T6, a second layer of the burr of the semiconductor wafer 10 is polished at time T8, and a third layer of the burr of the semiconductor wafer 10 is polished at time T10 to time T14. By comparing the peak PK3 with data set in advance, the determination unit 9 illustrated in FIG. 1 determines the polished amount (or the polished depth) of the polishing unit 3.

In addition, as illustrated in FIG. 3C, in a case where the peak PK2 corresponding to the polishing unit 4 is constant, it can be determined that the polishing unit 4 polishes the semiconductor wafer 10 with constant polishing pressure F2. In a case where the semiconductor wafer 10 is polished with the constant polishing pressure F2, a change in the peak PK4 illustrated in FIG. 3O represents a change in the polished layer of the semiconductor wafer 10. Accordingly, the polished amount (or the polished depth) according to the polishing unit 4 can be determined based on a change in the peak PK4. For the example illustrated in FIG. 3C, it can be determined that, by the polishing unit 4, the first layer of the burr of the semiconductor wafer 10 is polished at time T1 to time T5, the second layer of the burr of the semiconductor wafer 10 is polished at time T7, and the third layer of the burr of the semiconductor wafer 10 is polished at time T9 to time T13. By comparing the peak PK4 with data set in advance, the determination unit 9 illustrated in FIG. 1 determines the polished amount (or the polished depth) of the polishing unit 4.

In this way, based on the result of measurements of the strains $\epsilon_1$ and $\epsilon_2$, which is acquired by the strain gauges 14 and 15 according to an embodiment, the polished amount according to the polishing unit 3 of the semiconductor wafer 10 and the polished amount according to the polishing unit 4 can be separately acquired. Accordingly, when the polishing units 3 and 4 polish different positions of the semiconductor wafer 10 in the radial direction D1, polished amounts of the semiconductor wafer 10 corresponding to the different positions in the radial direction of the semiconductor wafer 10 can be determined.

In contrast to this, a case will be described in which the polished amount or the polished depth of the semiconductor wafer 10 is determined based on the table torque of the stage 2 as a comparative example. In the case of the comparative example, while a change in the polished amount of the semiconductor wafer 10 or a change in the polished depth thereof can be roughly acquired as a whole based on a change in the table torque, the polished amounts or the polished depths according to the polishing units 3 and 4 cannot be separately determined.

Figure 4A:
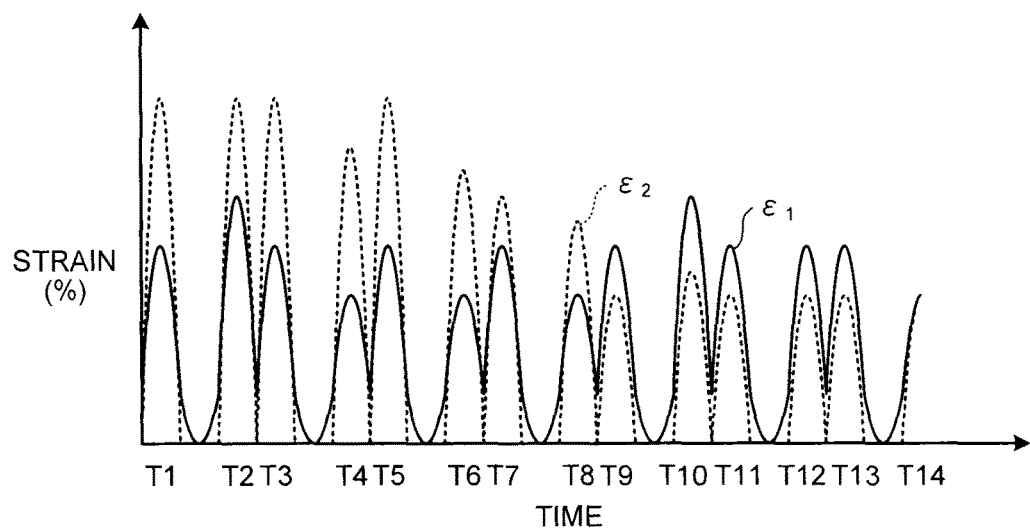
FIG. 4A is a timing diagram that illustrates a second example of a measurement result acquired by a strain gauge.
Figure 4B:
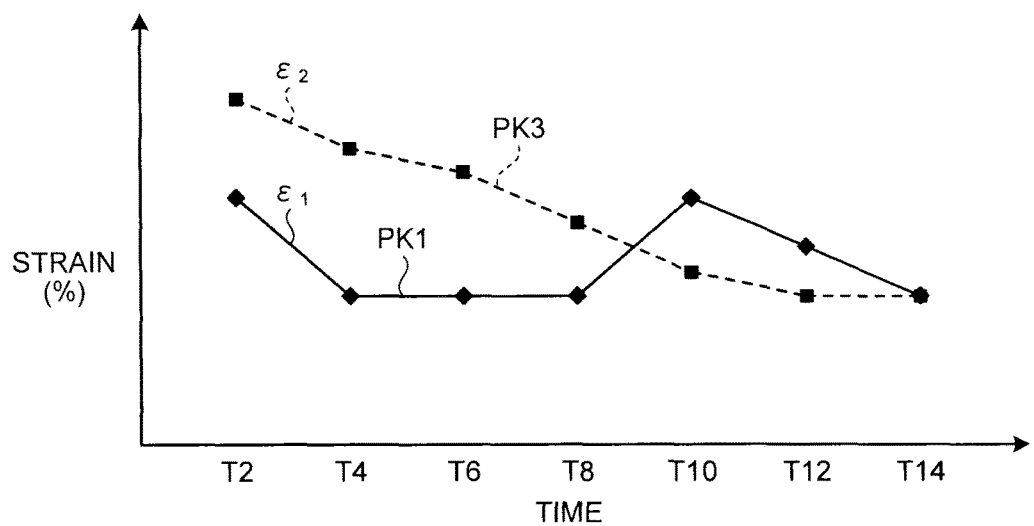
FIG. 4B is a timing diagram that illustrates a result of extraction of some peaks from the measurement result acquired by the strain gauge.

FIGS. 4A to 4C are diagrams that illustrate a second example of a result of measurements of the strains $\epsilon_1$ and $\epsilon_2$ that is acquired by using the strain gauges 14 and 15. FIG. 4A illustrates an example of the result of measurements of the strains $\epsilon_1$ and $\epsilon_2$ acquired by using the strain gauges 14 and 15 included in one of the plurality of strain measuring units 5 to 8 illustrated in FIG. 2. FIG. 4B is a diagram acquired by extracting the peaks PK1 and PK3 that are strongly influenced by the polishing unit 3 from a plurality of peaks illustrated in FIG. 4A and plotting the extracted peaks. FIG. 4C is a diagram acquired by extracting the peaks PK2 and PK4 that are strongly influenced by the polishing unit 4 from the plurality of peaks illustrated in FIG. 4A and plotting the extracted peaks.

As illustrated in FIG. 4B, the peak PK1 is not constant but irregularly changes. In this way, in a case where the peak PK1 changes, the polishing unit 3 polishes the semiconductor wafer 10 with the polishing pressure F1 being changed. Accordingly, the polishing unit 3, for example, is suspected to have an abnormality such as a malfunction. In a case where such an irregular change in the peak PK1 in time is detected while the polishing unit 3 is set to polish the semiconductor wafer 10 with the constant polishing pressure F1, the determination unit 9 determines the operation state of the polishing unit 3 to be abnormal. For example, in a case where a change in the peak PK1 in time is larger than a predetermined threshold, the determination unit 9 determines the operation state of the polishing unit 3 to be abnormal. On the other hand, in a case where the change in the peak PK1 in time is smaller than the predetermined threshold, the determination unit 9 determines the operation state of the polishing unit 3 to be normal. As illustrated in FIG. 4B, in a case where the peak PK1 changes much, the polishing unit 3 does not polish the semiconductor wafer 10 with the constant polishing pressure F1. Accordingly, it cannot be determined whether a change in the peak PK3 illustrated in FIG. 4B is due to a change in the polishing pressure F1 or is due to a change in the polished layer. For this reason, in a case where the change in the peak PK1 in time is larger than the predetermined threshold, a determination of the polished amount based on the peak PK3 is not performed.

On the other hand, in the case illustrated in FIG. 4C, similar to the case illustrated in FIGS. 3A to 3C, the peak PK2 is constant and exhibits regularity. Thus, the determination unit 9 determines the operation state of the polishing unit 4 to be normal and determines a polished amount or a polished depth according to the polishing unit 4 based on the peak PK4. In this way, in the case as illustrated in FIGS. 4A to 4C, even when the operation state of one polishing unit 3 is determined to be abnormal, the determination unit 9 determines a polished amount or a polished depth according to the other polishing unit 4.

As above, according to the embodiment, a plurality of peaks included in the result of measurements of the strain $\epsilon_1$ that is acquired by the strain gauge 14 are separated into a plurality of peaks PK1 corresponding to the polishing unit 3 and a plurality of peaks PK2 corresponding to the polishing unit 4, and a plurality of peaks included in the result of measurements of the strain $\epsilon_2$ that is acquired by the strain gauge 15 are separated into a plurality of peaks PK3 corresponding to the polishing unit 3 and a plurality of peaks PK4 corresponding to the polishing unit 4. In addition, it is determined whether the polishing unit 3 is normal or abnormal based on the peaks PK1, and it is determined whether the polishing unit 4 is normal or abnormal based on the peaks PK2. Furthermore, in a case where the polishing unit 3 is determined to be normal, a polished amount or a polished depth according to the polishing unit 3 is determined based on the peaks PK3. In addition, in a case where the polishing unit 4 is determined to be normal, a polished amount or a polished depth according to the polishing unit 4 is determined based on the peaks PK4.

Next, a method of polishing a semiconductor wafer 10 using the polishing device 1 illustrated in FIGS. 1 and 2 will be described. First, the rear surface 10a of the semiconductor wafer 10 that is a polishing target is mounted on the upper face 2a of the stage 2, and the semiconductor wafer 10 is hold on the stage 2 through vacuum suction executed by the vacuum suction mechanism 20. Subsequently, the semiconductor wafer 10 is rotated around the axis A1 at a high speed by rotating the stage 2. At this time, the polishing tapes 11 of the polishing units 3 and 4 are brought into contact with the outer circumferential parts of the rear surface 10a of the semiconductor wafer 10, and the polishing pressures F1 and F2 are applied to the rear surface 10a, whereby frictional forces F3 and F4 are generated between the polishing tape 11 and the rear surface 10a. The rear surface 10a of the semiconductor wafer 10 is polished depending on these frictional forces F3 and F4. Then, in order to control the polishing of the semiconductor wafer 10 with high accuracy, during the polishing process of the rear surface 10a, the strains $\epsilon_1$ and $\epsilon_2$ of the stage 2 are measured by using the strain gauges 14 and 15, and the radial-direction strain and the rotation-direction strain of the semiconductor wafer 10 are detected based on the strains $\epsilon_1$ and $\epsilon_2$.

The determination unit 9 individually determines the polished state of the semiconductor wafer 10 according to the polishing unit 3 and the polished state of the semiconductor wafer 10 according to the polishing unit 4 based on a result of measurements of the strains $\epsilon_1$ and $\epsilon_2$. FIG. 5 is a flowchart that illustrates the determination process sequence executed by the determination unit 9. The determination unit 9 acquires results of measurements of the strains $\epsilon_1$ and $\epsilon_2$ from the strain gauges 14 and 15 (S100). The determination unit 9 extracts a plurality of peaks included in the result of the measurement of the strain $\epsilon_1$ acquired by the strain gauge 14 and a plurality of peaks included in the result of the measurement of the strain $\epsilon_2$ acquired by the strain gauge 15 (S110).

Next, the determination unit 9 separates the plurality of peaks included in the result of the measurement of the strain $\epsilon_1$ acquired by the strain gauge 14 into a plurality of peaks PK1 corresponding to the polishing unit 3 and a plurality of peaks PK2 corresponding to the polishing unit 4 (S120), and separates the plurality of peaks included in the result of the measurement of the strain $\epsilon_2$ acquired by the strain gauge 15 into a plurality of peaks PK3 corresponding to the polishing unit 3 and a plurality of peaks PK4 corresponding to the polishing unit 4 (S130).

The determination unit 9 determines the polished state of the semiconductor wafer 10 according to the polishing unit 3 based on the peaks PK1 and PK3 (S140). In addition, the determination unit 9 determines the polished state of the semiconductor wafer 10 according to the polishing unit 4 based on the peaks PK2 and PK4 (S150).

Figure 6:
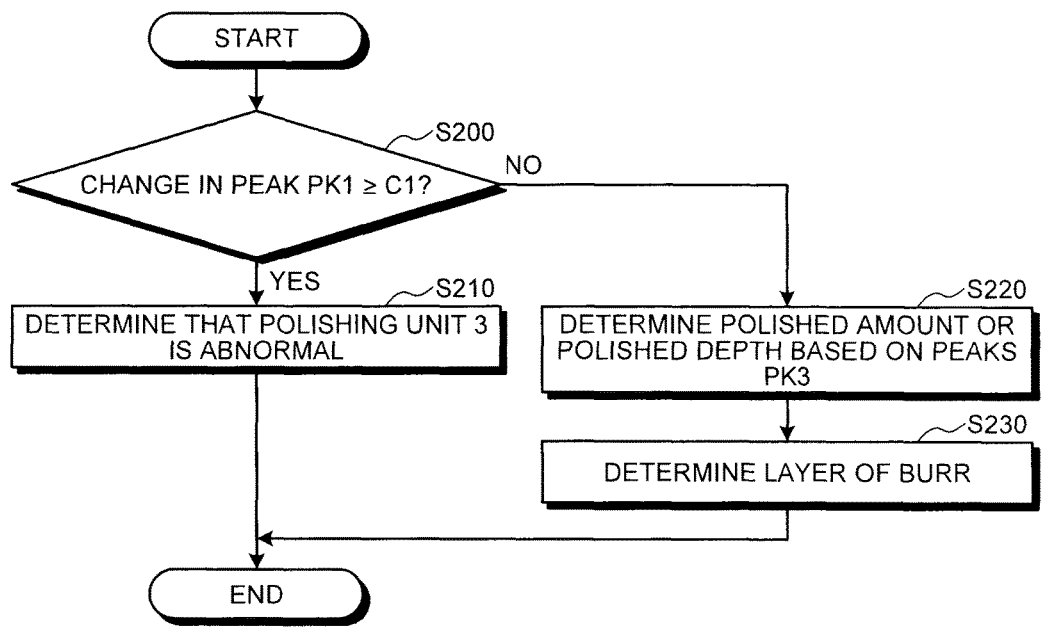
FIG. 6 is a flowchart that illustrates the process sequence for determining a polished state of one polishing unit.

FIG. 6 is a flowchart that illustrates a detailed sequence of the process of Step S140. The determination unit 9 determines whether or not a change in the peak PK1 is the threshold C1 or more (S200). In a case where the change in the peak PK1 is the threshold C1 or more, the determination unit 9 determines an abnormality of the polishing unit 3 (S210), and ends the process. On the other hand, in a case where the change in the peak PK1 is not the threshold C1 or more, the determination unit 9 determines a polished amount or a polished depth according to the polishing unit 3 based on the peaks PK3 (S220). In addition, the determination unit 9 determines a layer of the burr that is polished (S230).

Figure 7:
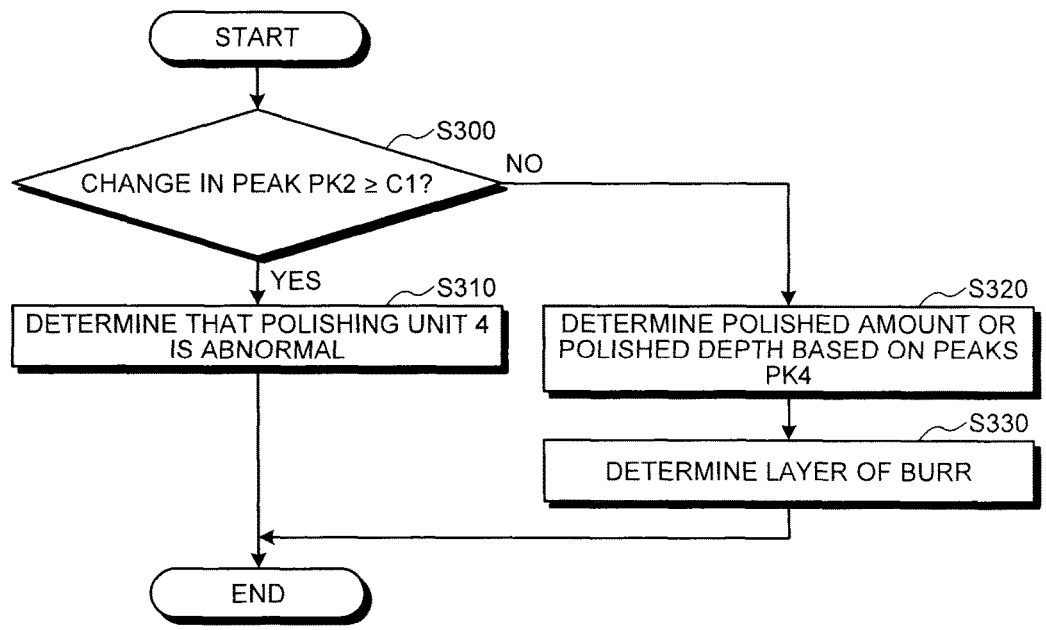
FIG. 7 is a flowchart that illustrates the process sequence for determining a polished state of the other polishing unit.

FIG. 7 is a flowchart that illustrates a detailed sequence of the process of Step S150. The determination unit 9 determines whether or not a change in the peak PK2 is the threshold C1 or more (S300). In a case where the change in the peak PK2 is the threshold C1 or more, the determination unit 9 determines an abnormality of the polishing unit 4 (S310), and ends the process. On the other hand, in a case where the change in the peak PK2 is not the threshold C1 or more, the determination unit 9 determines a polished amount or a polished depth according to the polishing unit 4 based on the peaks PK4 (S320). In addition, the determination unit 9 determines a layer of the burr that is polished (S330).

In the description presented above, while a case has been illustrated in which one strain measuring unit is present, by compositing results of measurements acquired by a plurality of strain measuring units 5 to 8, the determination unit 9 can perform a determination with higher accuracy. The determination unit 9, for example, switches the outputs of four strain measuring units 5 to 8 according to the rotation angle of the stage 2 such that the peaks PK1 to PK4 illustrated in FIGS. 3A to 3C are sequentially acquired from outputs of the plurality of the strain measuring units 5 to 8. For example, the output of the strain measuring unit 5 is selected when the rotation angle of the stage 2 is in the range of 0 degree to 90 degrees, the output of the strain measuring unit 6 is selected when the rotation angle is in the range of 90 degrees to 180 degrees, the output of the strain measuring unit 7 is selected when the rotation angle is in the range of 180 degrees to 270 degrees, and the output of the strain measuring unit 8 is selected when the rotation angle is in the range of 270 degrees to 360 degrees. As a result, the peaks PK1 to PK4 can be acquired at a time interval of ¼ of that of the case illustrated in FIGS. 3A to 3C. Accordingly, as the number of strain measuring units increases, the measurement accuracy increases.

According to the embodiment, the radial-direction strain $\epsilon_1$ of the semiconductor wafer 10 is measured by the strain gauge 14, the circumferential-direction strain $\epsilon_2$ of the semiconductor wafer 10 is measured by the strain gauge 15, and the polished state of the semiconductor wafer 10 is determined based on the strains $\epsilon_1$ and $\epsilon_2$. Accordingly, the polished state can be measured with high accuracy. In addition, the polished states of the semiconductor wafer 10 can be individually acquired for the plurality of polishing units.

While certain embodiments have been described herein, these embodiments have been presented by way of example only, and are not intended to limit the scope of the present invention. Indeed, the novel embodiments described herein may be embodied in a variety of other embodiments; furthermore, various omissions, substitutions and changes in the form of the embodiments described herein may be made without departing from the spirit of the invention. The accompanying claims and their equivalents are intended to cover such embodiments or modifications as would fall within the scope and spirit of the invention.

What is claimed is:
1. A polishing device comprising:
a stage on which a semiconductor wafer is mounted, the stage sucking a center side of a rear surface of the semiconductor wafer and being rotatable together with the semiconductor wafer;
a polishing unit that applies a force to and polishes the rear surface of the semiconductor wafer mounted on the stage, the polishing unit polishing the rear surface of the semiconductor wafer beside the stage sucking the center side of the rear surface of the semiconductor wafer; and
a strain measuring unit that measures a first strain and a second strain during the polishing, the first strain being a radial-direction strain of the semiconductor wafer, the second strain being a circumferential-direction strain of the semiconductor wafer, the strain measuring unit being disposed on the stage.

2. The polishing device according to claim 1, wherein the strain measuring unit comprises a first strain gauge that measures the first strain and a second strain gauge that measures the second strain.

3. The polishing device according to claim 1, wherein the polishing unit comprises a first polishing unit and a second polishing unit that are arranged dispersedly at a rear surface side of the semiconductor wafer.

4. The polishing device according to claim 3, wherein the first and second polishing units are movable in a radial direction of the semiconductor wafer.

5. The polishing device according to claim 4, wherein the first and second polishing units simultaneously polish mutually-different positions with respect to the radial direction of the rear surface of the semiconductor wafer.

6. The polishing device according to claim 1, wherein the strain measuring unit is disposed on a lower face of the stage.

7. The polishing device according to claim 6, wherein the strain measuring unit includes a plurality of strain measuring devices arranged dispersedly in a circumferential direction of the semiconductor wafer.

8. The polishing device according to claim 1, further comprising a determination unit that determines a polished state of the semiconductor wafer based on the first and second strains.

9. The polishing device according to claim 8, wherein the determination unit determines whether the polished state is normal or abnormal based on the first strain.

10. The polishing device according to claim 9, wherein the determination unit determines that the polished state is normal when a temporal change in a plurality of peaks included in the first strain is smaller than a threshold and determines that the polished state is abnormal when the temporal change in the peaks included in the first strain is larger than the threshold.

11. The polishing device according to claim 9, wherein the determination unit determines a polished amount or a polished depth of the semiconductor wafer based on a plurality of peaks included in the second strain in a case where the polished state is determined to be normal.

12. The polishing device according to claim 3, further comprising a determination unit that determines polished states of the semiconductor wafer by the first and second polishing units based on the first and second strains.

13. The polishing device according to claim 12, wherein the determination unit is configured to:
 separate a plurality of peaks included in the first strain into first peaks and second peaks, the first peaks including a plurality of peaks corresponding to the first polishing unit, the second peaks including a plurality of peaks corresponding to the second polishing unit;
 separate a plurality of peaks included in the second strain into third peaks and fourth peaks, the third peaks including a plurality of peaks corresponding to the first polishing unit, the fourth peaks including a plurality of peaks corresponding to the second polishing unit;
 determine a polished state of the semiconductor wafer by the first polishing unit based on the first and third peaks; and
 determine a polished state of the semiconductor wafer by the second polishing unit based on the second and fourth peaks.

14. The polishing device according to claim 13, wherein the determination unit is configured to:
 determine whether the first polishing unit is normal or abnormal based on the first peaks; and
 determine whether the second polishing unit is normal or abnormal based on the second peaks.

15. The polishing device according to claim 14, wherein the determination unit is configured to:
 determine a polished amount or a polished depth by the first polishing unit based on the third peaks in a case where the first polishing unit is determined to be normal; and
 determine a polished amount or a polished depth by the second polishing unit based on the fourth peaks in a case where the second polishing unit is determined to be normal.

* * * * *